Nov. 13, 1962 S. L. BROADHEAD, JR 3,064,196
NOISE LIMITER AND SQUELCH CIRCUIT
Filed Aug. 13, 1958
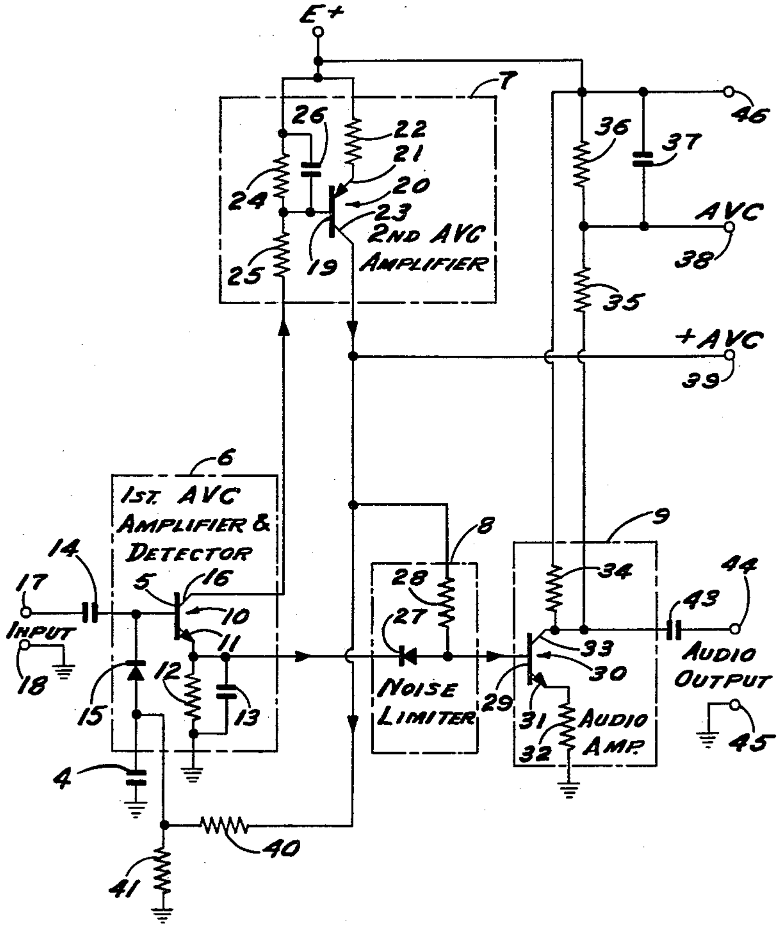
INVENTOR.
SAMUEL L. BROADHEAD JR.
BY *[signature]*
ATTORNEY

United States Patent Office 3,064,196
Patented Nov. 13, 1962

3,064,196

NOISE LIMITER AND SQUELCH CIRCUIT

Samuel L. Broadhead, Jr., Cedar Rapids, Iowa, assignor to Collins Radio Company, Cedar Rapids, Iowa, a corporation of Iowa Filed Aug. 13, 1958, Ser. No. 756,057
5 Claims. (Cl. 325—319)

This invention relates to improvements in signal receiver circuits and more particularly to a composite circuit and more particularly to a composite circuit that cooperates to provide positive and negative automatic volume control (AVC) voltage, squelch, and noise limiting.

It is an object of this invention to provide a composite circuit that provides positive AVC for transistors and negative AVC for vacuum tubes, and in addition performs squelch and noise limiting functions.

It is another object of this invention to provide a voltage doubler, semi-conductor detecting circuit which permits low-level signals to be detected with low distortion.

It is still another object of this invention to provide a circuit that is compact and readily adaptable to printed circuit techniques.

A feature of this invention is the method of accomplishing squelch wherein the semi-conductor components are operated at cut off until the signal level reaches a potential high enough to overcome the semi-conductor's contact-potential, at which time the detector and amplifier become operative by reaching a conductive state.

Another feature of this invention is an AVC voltage with a rapid initial rise time which is accomplished by introducing a non-linear impedance in the form of positive feedback to the detector, AVC amplifier circuit which results in the AVC voltage initially rising faster than the time constant in the circuit would normally permit.

This invention features a first transistor in combinaiton with a diode that functions as a voltage doubler detector and as the first stage of an AVC amplifier. A second transistor acts as the second stage of the AVC amplifier and provides positive-going AVC voltage for the transistors in the receiver. A third transistor functions as an audio amplifier and as a source for negative-going AVC voltage. A diode is connected between the first and third transistors, and acts as a series noise limiter. Positive AVC voltage is applied to the anode of the series noise limiter circuit which biases the diode to conduction and simultaneously permits audio voltage to pass from the first to the third transistor. The third transistor amplifies the audio signal which is delivered to the final amplifier stage of the receiver. Negative-going AVC voltage which is required for vacuum tubes in the receiver is also obtained from the third transistor circuit.

Other objects and features of this invention will become apparent to one skilled in the art from the following description and accompanying drawing.

Referring now to the drawing, an input signal, such as from a receiver intermediate frequency amplifier, is provided to a pair of input terminals 17 and 18. The input signal is provided to an AVC amplifier and detector 6 through a blocking capacitor 14. The AVC amplifier and detector consists of a transistor 10, which may be of the NPN type, that has an emitter 11 connected to ground through a parallel network consisting of a resistive load 12 and a radio frequency (RF) by-pass capacitor 13. The base 5 of transistor 10 is connected to blocking capacitor 14, and to the cathode of a detector diode 15. The anode of diode 15 is bypassed to ground through a capacitor 4. The output from the first stage of the AVC amplifier appears on collector 16 of transistor 10. A pair of dropping resistors 24 and 25 are connected between collector 16 and a positive direct voltage source E+. The audio component of the direct current (D.C.) voltage applied to a second AVC amplifier 7 is filtered by resistor 24 in parallel with capacitor 26.

The junction between resistors 24 and 25 is connected to a base 19 of a second transistor 20, which is the second stage of AVC amplifier 7. The second transistor 20 may be a PNP type, when transistor 10 is a NPN type. The emitter 21 is connected to E+ through a resistor 22. AVC voltage appears at the collector 23 of transistor 20. Collector 23 is connected to the anode of a nose limiting diode 27 through a resistance 28. The cathode of the noise limiting diode is connected to emitter 11 of the detector transistor 10 and furnishes a path for the audio signal which is developed across resistive load 12. The audio signal passes through diode 27 to a base 29 of an audio amplifier 9 which includes a third transistor 30 which may be of the same type as transistor 10. Its emitter 31 is connected to ground through a resistor 32. Its collector 33 is connected to a pair of output terminals 44 and 45 through a blocking capacitor 43.

Negative-going AVC for vacuum tubes in a receiver (not shown) is developed across a pair of dropping resistors 35 and 36 connected between collector 33 and voltage source E+. A filter capacitor 37 is in parallel with resistor 36. Positive bias for collector 33 is obtained by connecting the collector to E+ through resistor 34.

*Voltage Doubler Detection*

Incoming voltage is applied to the base 5 of transistor 10. Emitter 11 and base 5 act as a diode and with detector diode 15 provide a voltage doubling circuit. Voltage doubling detection is accomplished upon the application of an input signal to the detector as follows: when the input signal is on the negative portion of its cycle, transistor 10 is cut off and detector diode 15 is conductive, allowing current to pass which will be stored on blocking capacitor 14. As the input signal swings positive, transistor 10 will conduct and release part of the stored energy from blocking capacitor 14 to RF by-pass capacitor 13. Eventually capacitors 13 and 14 will reach a potential nearly equal to the peak-to-peak voltage of the incoming signal. The time constant of the RF filter comprising resistor 12 and RF by-pass capacitor 13 is such that the modulation envelope of the incoming signal will be followed.

The addition of positive feedback to the detector raises the positive potential of the capacitors 13 and 14 to a level higher than the signal itself would permit. This condition permits undistorted reception of lower peak-to-peak input signals since the peak of the modulation envelope will not fall below the contact-potential of the semi-conductors in the detector.

Voltage developed by the voltage doubler detector is applied across the by-pass capacitor 13 and subsequently to the cathode of diode 27 in noise limiter 8.

*Automatic Volume Control*

Initially, transistor 10 is in a state of non-conduction because its base 5 and emitter 11 are at ground potential. When the incoming signal voltage exceeds the contact-potential of transistor 10, it conducts and current flows from the E+ through dropping resistors 24 and 25 to the collector 16 of transistor 10.

Transistor 20 is initially non-conductive because its emitter 21 and base 19 are at E+ potential. The voltage on base 19 at the junction of dropping resistors 24 and 25 drops below the emitter potential of PNP transistor 20 when transistor 10 becomes conductive and causes transistor 20 to be biased to conduction. The voltage appearing at collector 23 is applied as positive-going AVC voltage at terminal 39. Terminals 39 and 46 are connected to receiver circuitry (not shown) which requires positive-going AVC voltage. In transistorized circuitry it is possible and necessary to utilize positive-going AVC voltage as well as negative AVC voltage.

When the AVC circuit reaches a conductive state, positive AVC voltage is simultaneously applied to the anode of diode 27 and the base 29 of the audio amplifier transistor 30. Transistor 30 and noise liimter diode 27 are normally non-conductive, but are rendered conductive by the positive-going AVC voltage. The audio signal will then pass from the detector through the noise limiter 8 to the audio amplifier 9 and finally to the output terminals 44 and 45. Normally, the instant the AVC become operable, the increase in the AVC voltage at terminal 39 would be dependent upon the time constant of the audio filter comprising resistors 24, 25 and capacitor 26. However, a portion of the AVC voltage is returned to the voltage doubling detector and first AVC amplifier circuit 6 which reacts as positive feedback to a D.C. amplifier. This feedback introduces non-linearity into the circuit resulting in effective negative or unity resistance in the AVC amplifiers. Under this condition, increase in AVC voltage will not be dependent upon the time constant of the audio filter and hence will build up in much less time considerably improving the stability of the over-all performance of the receiver.

*Noise Limiting*

If a large positive noise pulse appears on the cathode of the diode 27, the cathode will become more positive than the anode and render the circuit nonconductive for the period of time the pulse is on the cathode.

*Squelching*

Squelching is obtained when all circuits are at cutoff since the emitter and base of each transistor are at the same potential. A silicon transistor which may be used in this circuit requires approximately one-half volt difference between the base and emitter to overcome its contact potential and make it conductive. Hence, the contact potential is used to obtain squelch cutoff for signal levels below about one-half volt.

However, once the signal exceeds the contact potential level, AVC amplifiers 6 and 7 inject positive voltage at the anode of detector diode 15, which provides a positive bias on the base of transistor 10. This voltage is provided through the voltage divider comprising resistors 40 and 41. This voltage further drives transistor 10 into conduction since the detector voltage at base 5 and the AVC voltage are both positive. Thus positive feedback is developed which will suddenly increase the positive bias of the detector above threshold thereby making a stable on-off squelching action.

*Negative-Going Automatic Volume Control*

A negative-going AVC voltage is developed from the output of audio amplifier 9. Current flowing from E+ to the collector 33 of transistor 30 develops a potential across serially connected resistors 36 and 35. The voltage at the junction of resistors 36 and 35 is negative with respect to E+ and is connected to terminal 38 for negative-going AVC voltage using terminal 46 as the common electrical connection.

Therefore, the above description discloses a composite circuit that uses few parts that cooperate to perform the function of squelch, detection, positive and negative AVC, and audio amplification. It is economical to build and lends itself to the requirements of subminiturization that are necessary in communication receivers.

Although this invention has been described with respect to a particular embodiment thereof, it is not to be so limited as changes and modifications may be made therein which are within the full intended scope of the invention as defined by the appended claims.

I claim:

1. A composite circuit comprising an input terminal, a first transistor, said transistor consisting of a least a base, a collector and an emitter, a first blocking capacitor connected between said input terminal and base of said first transistor, a detector including said first transistor and a first diode, one side of said first diode connected to the base of said first transistor, a capacitor connected between the said first diode and ground, an RF filter connected between the emitter of said first transistor and ground, an AVC amplifying means, said AVC amplifying means including a second transistor which contains at least a base, a collector, and an emitter, a source of positive voltage, the base of said second transistor resistively coupled to the collector of said first transistor and resistively coupled to said voltage source, the emitter of said second transistor being connected to said source of positive voltage an audio amplifier, said audio amplifier including a third transistor which includes at least a base, a collector and an emitter, a noise limiter, said noise limiter including a second diode, one end of said second diode connected to the emitter of said first transistor, the other end of said diode connected to the base of said third transistor; a first output terminal, a second blocking capacitor connected between the collector of the third transistor and the first output terminal, means connecting the emitter of said third transistor to ground, dropping resistors serially connected between said positive source of voltage and the collector of said third transistor, a negative-going AVC terminal connected to the junction of said serially connected resistors, a second output terminal connected to the collector of said second transistor, a voltage divider comprising serially connected resistors connected between the collector of said second transistor and ground, the junction of said voltage divider connected to the junction of said first diode and the capicitor connected between the first diode and ground, and the collector of said second transistor being resistively connected to the base of said third transistor whereby said composite circuit furnishes positive and negative AVC voltage and accomplishes squelch and noise limiting.

2. In a composite circuit a low signal level voltage doubling detector comprising an input terminal, a first transistor which contains at least a base, a collector and an emitter, a first blocking capacitor connected between said input terminal and said base of the first transistor, a diode and capacitor serially connected, said diode connected to the base of the first transistor, said capacitor connected to ground, an RF filter connected between the emitter of the first transistor and ground, a voltage source, a second transistor which contains a base, a collector and an emitter, the base of said second transistor resistively coupled to the collector of said first transistor and connected to said voltage source, the emitter of said second transistor being connected to said voltage source, a voltage dividing network connected between the collector of said second transistor and ground and means for applying an output from said voltage divider to the junction of the serially connected diode and capacitor, whereby additional bias is supplied to said first transistor from said second transistor.

3. A receiver audio circuit including a detector circuit and providing squelch, noise limiting and producing positive-going and negative-going automatic volume control voltages comprising a detector receiving an input signal, an automatic volume control amplifier receiving the output of said detector and producing a positive going automatic volume control signal, a series noise limiter receiving the output of said detecting means, and an audio amplifier receiving the output of the series noise limiter and producing a negative going automatic volume control signal and an output signal; said detector circuit including a first transistor having at least a base, a first electrode, and a second electrode; direct current blocking means connected between an input terminal and the base of the first transistor; a series connected diode and capacitor with said diode connected to the base of the first transistor and said capacitor connected to ground; a voltage source; a second transistor having a base, a first electrode and a second electrode, the base of said second transistor being resistively coupled to the first electrode of said first transistor, the second electrode of said second transistor being connected to said voltage source; a voltage dividing network connected between the first electrode of said second transistor and ground, and means for applying an output from said voltage divider to the junction of the serially connected diode and capacitor whereby voltage feedback is applied to said first transistor from said second transistor.

4. In the circuit of claim 3, means for feeding an AVC signal from the automatic volume control amplifier to the series noise limiter so as to adjust its clipping level in response to the detected signal.

5. A low signal level voltage doubling detector comprising an input terminal, a first transistor having at least a base, a first electrode, and a second electrode, a first blocking capacitor connected between said input terminal and the base of the first transistor, a diode and capacitor serially connected, said diode connected to the base of the first transistor and said capacitor connected to ground, an RF filter connected to the second electrode of the first transistor, a voltage source, a second transistor having a base, a first electrode, and a second electrode, the base of said second transistor being resistively coupled to the first electrode of said first transistor, the second electrode of said second transistor being connected to said voltage source, a voltage dividing network connected between the first electrode of said second transistor and ground, and means for applying an output from said voltage divider to the junction of the serially connected diode and capacitor, whereby additional bias is supplied to said first transistor from said second transistor.

References Cited in the file of this patent

UNITED STATES PATENTS

| | | |
|---|---|---|
| 2,337,005 | Selby | Dec. 14, 1943 |
| 2,957,074 | Trevor | Oct. 18, 1960 |
| 2,983,815 | Guyton et al. | May 9, 1961 |

FOREIGN PATENTS

| | | |
|---|---|---|
| N11,890V | Germany | Oct. 18, 1956 |

OTHER REFERENCES

Koch, "Transistor Audio Amplifier Feedback Circuit," RCA TN No. 64, Jan. 2, 1958.